(12) United States Patent
Ward

(10) Patent No.: US 8,808,573 B2
(45) Date of Patent: Aug. 19, 2014

(54) COMPOSITIONS AND METHODS FOR SELECTIVE POLISHING OF SILICON NITRIDE MATERIALS

(75) Inventor: William Ward, Glen Ellyn, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 125 days.

(21) Appl. No.: 13/087,857

(22) Filed: Apr. 15, 2011

(65) Prior Publication Data

US 2012/0264304 A1   Oct. 18, 2012

(51) Int. Cl.
    *C09K 13/08*   (2006.01)
(52) U.S. Cl.
    USPC ........ 252/79.4; 252/79.1; 438/69.2; 438/69.3
(58) Field of Classification Search
    USPC ......... 438/691, 692, 693, 694; 252/79.1, 2, 3, 252/79.2, 79.3, 79.4; 216/88, 89
    See application file for complete search history.

(56) References Cited

U.S. PATENT DOCUMENTS

| | | | | |
|---|---|---|---|---|
| 2006/0108326 | A1* | 5/2006 | Dysard et al. | 216/88 |
| 2007/0218811 | A1* | 9/2007 | Kurata et al. | 451/28 |
| 2008/0254717 | A1* | 10/2008 | Fukasawa et al. | 451/36 |
| 2009/0202816 | A1* | 8/2009 | Schlenoff | 428/331 |
| 2009/0253355 | A1* | 10/2009 | Koyama et al. | 451/41 |

\* cited by examiner

*Primary Examiner* — Lan Vinh
(74) *Attorney, Agent, or Firm* — Thomas E Omholt; Robert J Ross; Steven D Weseman

(57) ABSTRACT

The present invention provides an acidic aqueous polishing composition suitable for polishing a silicon nitride-containing substrate in a chemical-mechanical polishing (CMP) process. The composition, at point of use, comprises about 0.01 to about 2 percent by weight of a particulate calcined ceria abrasive, about 10 to about 1000 ppm of at least one cationic polymer, optionally, about 10 to about 2000 ppm of a polyoxyalkylene polymer; and an aqueous carrier therefor. The at least one cationic polymer is selected from a poly(vinylpyridine) polymer and a combination of a poly(vinylpyridine) polymer and a quaternary ammonium-substituted polymer. Methods of polishing substrates and of selectively removing silicon nitride from a substrate in preference to removal of polysilicon using the compositions are also provided.

28 Claims, 1 Drawing Sheet

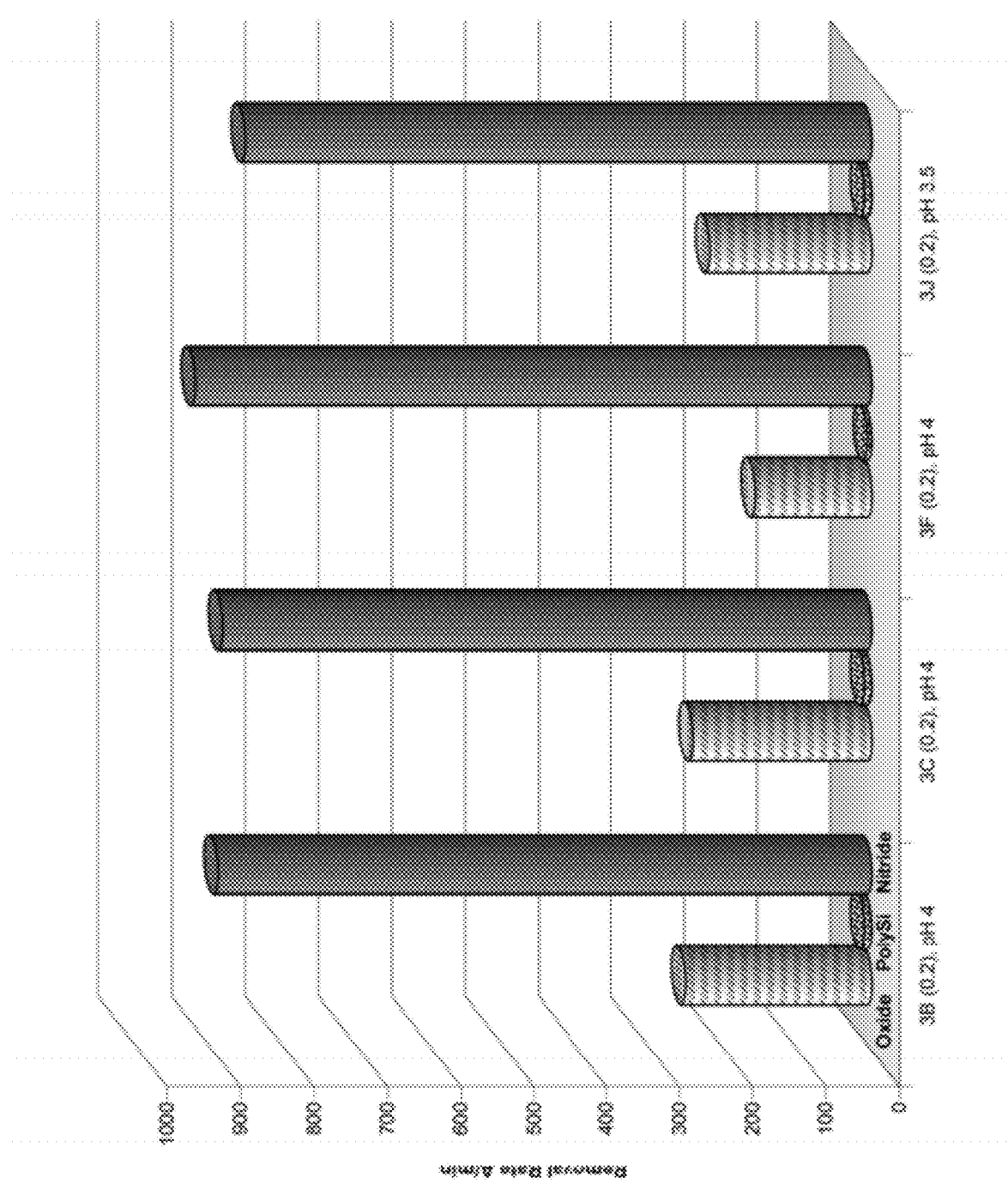

COMPOSITIONS AND METHODS FOR SELECTIVE POLISHING OF SILICON NITRIDE MATERIALS

FIELD OF THE INVENTION

This invention relates to polishing compositions and methods. More particularly, this invention relates to methods for polishing silicon nitride-containing substrates and compositions therefor.

BACKGROUND OF THE INVENTION

A semiconductor wafer for integrated circuits typically includes a substrate, such as silicon or gallium arsenide, on which a plurality of transistors have been formed. Transistors are chemically and physically connected to the substrate by patterning regions in the substrate and layers on the substrate. The transistors and layers are separated by interlevel dielectrics (ILDs), comprised primarily of some form of silicon oxide ($SiO_2$). The transistors are interconnected through the use of well-known multilevel interconnects. Typical multilevel interconnects are comprised of stacked thin-films consisting of one or more of the following materials: titanium (Ti), titanium nitride (TiN), tantalum (Ta), aluminum-copper (Al—Cu), aluminum-silicon (Al—Si), copper (Cu), tungsten (W), doped polysilicon (poly-Si), and various combinations thereof. In addition, transistors or groups of transistors are isolated from one another, often through the use of trenches filled with an insulating material such as silicon dioxide, silicon nitride, and/or polysilicon. During semiconductor manufacture, various layers of the aforementioned materials must be removed in order to form the various components of the circuits on the wafer, which typically is achieved by chemical-mechanical polishing (CMP).

Compositions and methods for CMP of the surface of a substrate are well known in the art. Polishing compositions (also known as polishing slurries, CMP slurries, and CMP compositions) for CMP of surfaces of semiconductor substrates (e.g., for integrated circuit manufacture) typically contain an abrasive, various additive compounds, and the like.

In conventional CMP techniques, a substrate carrier or polishing head is mounted on a carrier assembly and positioned in contact with a polishing pad in a CMP apparatus. The carrier assembly provides a controllable pressure to the substrate, urging the substrate against the polishing pad. The pad and carrier, with its attached substrate, are moved relative to one another. The relative movement of the pad and substrate serves to abrade the surface of the substrate to remove a portion of the material from the substrate surface, thereby polishing the substrate. The polishing of the substrate surface typically is further aided by the chemical activity of the polishing composition (e.g., by oxidizing agents, acids, bases, or other additives present in the CMP composition) and/or the mechanical activity of an abrasive suspended in the polishing composition. Typical abrasive materials include silicon dioxide, cerium oxide, aluminum oxide, zirconium oxide, and tin oxide.

In general, CMP involves the concurrent chemical and mechanical abrasion of surface, e.g., abrasion of an overlying first layer to expose the surface of a non-planar second layer on which the first layer is formed. One such process is described in U.S. Pat. No. 4,789,648 to Beyer et al. Briefly, Beyer et al., discloses a CMP process using a polishing pad and a slurry to remove a first layer at a faster rate than a second layer until the surface of the overlying first layer of material becomes coplanar with the upper surface of the covered second layer. More detailed explanations of chemical mechanical polishing are found in U.S. Pat. Nos. 4,671,851, 4,910,155 and 4,944,836.

U.S. Pat. No. 5,527,423 to Neville, et al., for example, describes a method for chemically-mechanically polishing a metal layer by contacting the surface of the metal layer with a polishing slurry comprising high purity fine metal oxide particles suspended in an aqueous medium. Alternatively, the abrasive material may be incorporated into the polishing pad. U.S. Pat. No. 5,489,233 to Cook et al. discloses the use of polishing pads having a surface texture or pattern, and U.S. Pat. No. 5,958,794 to Bruxvoort et al. discloses a fixed abrasive polishing pad.

Although known CMP slurry compositions typically are suitable for limited purposes, many conventional compositions exhibit unacceptable polishing rates and correspondingly unacceptable selectivity for removal of insulator materials used in wafer manufacture. In addition, many known polishing slurries produce poor film removal traits for the underlying films or produce deleterious film-corrosion, which leads to poor manufacturing yields.

As the technology for integrated circuit devices advances, traditional materials are being used in new and different ways to achieve the level of performance needed for advanced integrated circuits. In particular, silicon nitride, silicon oxide, and polysilicon are being used in various combinations to achieved new and ever more complex device configurations. In general, the structural complexity and performance characteristics vary across different applications. There is an ongoing need for methods and compositions that allow for the removal rates of silicon nitride, silicon oxide and polysilicon materials to be adjusted or tuned during CMP to meet the polishing requirements for particular IC devices.

For example, there is a continuing need to achieve rapid silicon nitride removal rates for many IC device applications. Traditional polishing slurries have been designed for "stop on silicon nitride" applications, such as in shallow trench isolation (STI). Typical STI slurries utilize silica abrasives at high pH and high abrasive concentrations to achieve reasonable silicon nitride removal rates. The use of high abrasive particle concentrations has been associated with a high level of scratch defects in the polished devices.

There is an ongoing need to develop new polishing methods and compositions that provide relatively high rates of removal of silicon nitride and for selective removal of silicon nitride in preference to polysilicon, silicon oxide, or both. The present invention addresses these ongoing needs. These and other advantages of the invention, as well as additional inventive features, will be apparent from the description of the invention provided herein.

BRIEF SUMMARY OF THE INVENTION

The present invention provides an acidic aqueous polishing composition (e.g., having a pH of about 2 to about 6) suitable for removal of silicon nitride from a surface of a substrate in a chemical-mechanical polishing (CMP) process. The composition comprises a particulate calcined ceria abrasive, at least one cationic polymer, optionally a polyoxyalkylene polymer, and an aqueous carrier. The at least one cationic polymer is selected from a poly(vinylpyridine) polymer and a combination of a poly(vinylpyridine) polymer and a quaternary ammonium-substituted polymer, such as a quaternary ammonium-substituted acrylate or methacrylate polymer.

The abrasive concentration in the composition is about 0.01 to about 10 percent by weight (wt %), preferably about 0.05 to about 5 wt %. Preferably, the concentration of the abrasive in the composition, at the point of use in the present methods, is in the range of about 0.01 to about 2 wt %, more preferably about 0.05 to about 0.5 wt %. The concentration of the at least one cationic polymer in the composition is in the range of about 10 parts-per-million (ppm) to about 100,000 ppm, preferably about 15 ppm to about 10,000 ppm. At point of use, the composition preferably comprises about 10 ppm to about 1000 ppm of the at least one cationic polymer, more preferably about 15 ppm to about 100 ppm for each cationic polymer present. In a preferred embodiment, the polyoxyalkylene polymer is present in the composition at a concentration in the range of about 10 to about 200,000 ppm, more preferably about 200 to about 100,000 ppm. At point of use, the composition preferably comprises about 10 ppm to about 2000 ppm of the polyoxyalkylene polymer, more preferably about 200 ppm to about 1000 ppm.

In some preferred embodiments, the polyoxyalkylene polymer comprises a poly(ethylene glycol) polymer (i.e., a PEG) having an average number of ethylene glycol monomer units in the range of about 200 to about 2000, more preferably about 300 to about 1500 monomer units. In other preferred embodiments, the polyoxyalkylene polymer comprises a poly(ethylene glycol)-co-poly(propylene glycol) block copolymer, such as a poly(ethylene glycol)-end capped poly (propylene glycol), i.e., a PEG-PPG-PEG block copolymer.

In some preferred embodiments the at least one cationic polymer comprises a combination of a poly(vinylpyridine) polymer and a quaternary ammonium-substituted acrylate or methacrylate polymer, e.g., about 10 to about 90 ppm of a poly(vinylpyridine) polymer and about 15 to about 100 ppm of a quaternary ammonium-substituted acrylate or methacrylate polymer, at point of use.

In another aspect, the present invention provides a chemical-mechanical polishing method for polishing a silicon nitride-containing substrate with the CMP composition described above. A preferred method comprises the steps of contacting a surface of a silicon nitride-containing substrate with a polishing pad and the aqueous polishing composition, and causing relative motion between the polishing pad and the substrate while maintaining a portion of the polishing composition in contact with the surface between the pad and the substrate for a time period sufficient to abrade at least a portion of the substrate surface. The polishing composition comprises, at point of use, about 0.01 to about 2.0 percent by weight of the particulate calcined ceria abrasive, about 10 to about 1000 ppm of the at least one cationic polymer, about 10 to about 2000 ppm of the polyoxyalkylene polymer, and an aqueous carrier, as described above.

BRIEF DESCRIPTION OF THE DRAWINGS

FIG. 1 provides a graph of removal rate for silicon oxide (Oxide), polysilicon (PolySi), and silicon nitride (Nitride) obtained by polishing blanket wafers with selected compositions of the present invention.

DETAILED DESCRIPTION OF THE INVENTION

The present invention provides compositions and methods for polishing a silicon nitride-containing surface. In a preferred embodiment, a composition of the present invention comprises an acidic aqueous carrier containing about 0.01 to about 10 wt % of a particulate calcined ceria abrasive, about 10 to about 100,000 ppm of at least one cationic polymer, and optionally, about 10 to about 200,000 ppm of a polyoxyalkylene polymer.

The particulate calcined ceria abrasive can be present in the polishing composition at a concentration in the range of about 0.01 to about 10 wt %. Preferably, the ceria is present in the CMP composition at a concentration in the range of about 0.05 to about 5 wt %. At point of use, the ceria abrasive preferably is present at a concentration of about 0.01 to about 2 wt %, more preferably about 0.05 to about 0.5 wt % (e.g., about 0.1 to about 0.3 wt %). The abrasive particles preferably have a mean particle size in the range of about 30 nm to about 200 nm, more preferably about 75 nm to about 125 nm, as determined by laser light scattering techniques, which are well known in the art.

The particulate abrasive desirably is suspended in the polishing composition, more specifically in the aqueous carrier component of the polishing composition. When the abrasive is suspended in the polishing composition, it preferably is colloidally stable. The term "colloid" refers to the suspension of abrasive particles in the liquid carrier. "Colloidal stability" refers to the maintenance of that suspension over time. In the context of this invention, a ceria suspension is considered colloidally stable if, when the ceria suspension is placed into a 100 mL graduated cylinder and allowed to stand without agitation for a time of 2 hours, the difference between the concentration of particles in the bottom 50 mL of the graduated cylinder ([B] in terms of g/mL) and the concentration of particles in the top 50 mL of the graduated cylinder ([T] in terms of g/mL) divided by the total concentration of particles in the abrasive composition ([C] in terms of g/mL) is less than or equal to 0.5 (i.e., ([B]−[T])/[C]≤0.5). The value of ([B]−[T])/[C] desirably is less than or equal to 0.3, and preferably is less than or equal to 0.1.

As used herein and in the appended claims, the term "calcined ceria" refers to a cerium(IV) oxide material formed by heating (calcining) a hydrated cerium oxide or a decomposable precursor salt or mixture of salts such as cerium carbonate, cerium hydroxide, and the like. In the case of a hydrated cerium oxide, the material is heated at a temperature sufficient to remove water of hydration from the cerium oxide material (e.g., at a temperature of 600° C. or greater). In the case of precursor salts, the salts are heated at temperature above the decomposition temperature of the precursor (e.g., 600° C. or greater) to form $CeO_2$ (ceria) and at the same time drive off any water that may be present or formed. The ceria can include amounts of stabilizing dopant materials such as La and Nd, if desired, as is known in the art. Typically, calcined ceria particles are highly crystalline. Methods of preparing calcined ceria are well known in the art.

The compositions of the present invention are acidic, and preferably have a pH in the range of about 2 to about 6, more preferably about 3 to about 6. The acidity of the composition can be achieved and/or maintained by inclusion of a buffering material including an acidic component, which can be any inorganic or organic acid. In some preferred embodiments, the acidic component can be an inorganic acid, a carboxylic acid, an organophosphonic acid, an acidic heterocyclic compound, a salt thereof, or a combination of two or more of the foregoing. Non-limiting examples of suitable inorganic acids include hydrochloric acid, sulfuric acid, phosphoric acid, phosphorous acid, pyrophosphoric acid, sulfurous acid, and tetraboric acid, or any acidic salt thereof. Non-limiting examples of suitable carboxylic acids include, monocarboxylic acids (e.g., acetic acid, benzoic acid, phenylacetic acid, 1-naphthoic acid, 2-naphthoic acid, glycolic acid, formic acid, lactic acid, mandelic acid, and the like), and polycarboxylic acids (e.g., oxalic acid, malonic acid, succinic acid, adipic acid, tartaric acid, citric acid, maleic acid, fumaric acid, aspartic acid, glutamic acid, phthalic acid, isophthalic acid, terephthalic acid, 1,2,3,4-butanetetracarboxylic acid, itaconic acid, and the like), or any acidic salt thereof. Non-limiting examples of suitable organic phosphonic acids include phosphonoacetic acid, iminodi(methylphosphonic acid), DEQUEST® 2000LC brand amino-tri(methylenephosphonic acid), and DEQUEST® 2010 brand hydroxyethylidene-1,1-diphosphonic acid, both of which are available from Solutia, or any acidic salt thereof. Non-limiting examples of suitable acidic heterocyclic compounds include uric acid, ascorbic acid, and the like, or any acidic salt thereof.

In some embodiments, the cationic polymer component comprises a poly(vinylpyridine) polymer, such as poly(2-vinylpyridine), poly(4-vinylpyridine), a vinylpyridine copolymer, and the like. Vinylpyridine copolymers useful in the compositions and methods of the present invention include copolymers comprising at least one vinylpyridine monomer (e.g., 2-vinylpyridine, 4-vinylpyridine, or both) and at least one comonomer selected from a nonionic monomer and a cationic monomer. Non-limiting examples of nonionic comonomers include acrylamide, methacrylamide, N-vinylpyrrolidinone, and styrene. Non-limiting examples of cationic comonomers include diallylamine, dimethyldiallylamine, a 2-vinyl-N-methylpyridinium halide (e.g., chloride), a 4-vinyl-N-methylpyridinium halide (e.g., chloride), 2-(diethylaminoethyl)styrene, 2-(N,N-diethylaminoethyl)acrylate, 2-(N,N-diethylaminoethyl)methacrylate, N-(2-(N,N-diethylaminoethyl)methacrylamide, N-(2-(N,N-diethylaminopropyl)methacrylamide, a salt of any of the foregoing (e.g., a hydrochloride salt), an N-quaternized derivative of any of the foregoing (e.g., an N-methyl quaternized derivative), and the like. In addition, relatively small proportions of anionic monomers (e.g., acrylic acid, methacrylic acid, styrenesulfonic acid, 2-acrylamido-2-methylpropane sulfonic acid (AMPS), and the like) can be included in the copolymer, so long as the proportion of anionic monomer to cationic monomers is such that the copolymer retains an overall cationic charge.

In some other embodiments, the cationic polymer component comprises a combination of the poly(vinylpyridine) polymer as described herein and a quaternary ammonium-substituted polymer, such as a quaternary ammonium-substituted acrylate or methacrylate polymer. Non-limiting examples of such quaternary ammonium-substituted acrylate or methacrylate polymers include poly(methacryloyloxyethyl trimethylammonium halide) polymers, poly(acryloyloxyethyl trimethylammonium halide) polymers, poly(methacryloyloxyethyl dimethylbenzylammonium halide) polymers, poly(acryloyloxyethyl dimethylbenzylammonium halide) polymers, and the like. Preferably, the halide counter-ion of the quaternary ammonium group is chloride.

The cationic polymer can have any suitable molecular weight. Typically, the polishing composition comprises a cationic polymer having a weight average molecular weight of about 5 kDa or more (e.g., about 10 kDa or more, about 20 kDa or more, about 30 kDa or more, about 40 kDa or more, about 50 kDa or more, or about 60 kDa or more) cationic polymer. The polishing composition preferably comprises a cationic polymer having a molecular weight of about 100 kDa or less (e.g., about 80 kDa or less, about 70 kDa or less, about 60 kDa or less, or about 50 kDa or less). Preferably, the polishing composition comprises a cationic polymer having a molecular weight of about 5 kDa to about 100 kDa (e.g., about 10 kDa to about 80 kDa, about 10 kDa to about 70 kDa, or about 15 kDa to about 70 kDa.

The polyoxyalkylene component, also known as a poly (alkylene glycol), can be a homopolymer or copolymer (e.g., a block or random copolymer) comprising a plurality of oxyalkylene monomer units (i.e., alkylene glycol monomer units, such as ethylene glycol, propylene glycol, butylene glycol, and the like). For example, the polyoxyalkylene polymer can be a poly(ethylene glycol) polymer, a poly(ethylene glycol)-co-poly(propylene glycol) copolymer, and the like. The polyoxyalkylene polymer preferably comprises, on average, about 20 to about 2000 monomer units (e.g., ethylene glycol, propylene glycol, and the like), more preferably about 200 to about 2000 monomer units (e.g., about 300 to about 1500 monomer units). Such polymers are frequently referred to in the art by the type of polymer and the average number of monomer units, e.g., poly(ethylene glycol)-300, abbreviated PEG-300, which refers to a poly(ethylene glycol) polymer having an average of about 300 ethylene glycol ($CH_2CH_2O$), units, and therefore having a number average molecular weight of about 300×44=13200 Daltons.

In one preferred embodiment, the polyoxyalkylene polymer is a polyoxyethylene polymer, i.e., a poly(ethylene glycol) polymer. In other preferred embodiments, the polyoxyalkylene polymer comprises a poly(ethylene glycol)-co-poly (propylene glycol) copolymer block copolymer, such as a PEG-PPG-PEG block copolymer, e.g., PLURONIC L31 from BASF, which reportedly has a number average molecular weight of around 1100 to 1200 and includes a PPG core having an average or about 16 propylene glycol units, which is capped on each end with an average of about 2 ethylene glycol monomer units.

The compositions and methods of the invention provide useful silicon nitride removal rates and selectivity for removal of silicon nitride over removal of polysilicon. The compositions of the invention also typically provide moderate silicon oxide removal rates. In some particularly preferred embodiments, the silicon nitride removal rate is about 700 Angstroms-per-minute (Å/min) or greater and polysilicon removal of less than about 100 Å/min (typically less than about 25 Å/min) when polishing a silicon nitride or polysilicon blanket wafer, respectively, on a table-top CMP polisher at a down force of about 3 pounds-per-square inch (psi), a platen speed of about 100 revolutions-per-minute (rpm), a carrier speed of about 101 rpm, and a polishing slurry flow rate of about 150 milliliters-per-minute (mL/min) with a D100 polishing pad. The silicon oxide removal rates typically are less than about 400 Å/min under the same conditions.

The polishing compositions of the invention optionally can include one or more oxidizing agent (e.g., to oxidize a component of the semiconductor surface, such as a metal component). Oxidizing agents suitable for use in the polishing compositions and methods of the present invention include, without limitation hydrogen peroxide, persulfate salts (e.g., ammonium monopersulfate, ammonium dipersulfate, potassium monopersulfate, and potassium dipersulfate), periodate salts (e.g., potassium periodate), salts thereof, and a combination of two or more of the foregoing. Preferably, the oxidizing agent is present in the composition in an amount sufficient to oxidize one or more selected metallic or semiconductor material present in the semiconductor wafer, as is well known in the semiconductor CMP art.

The polishing compositions of the invention can also optionally include suitable amounts of one or more other additive materials commonly included in polishing compositions, such as metal complexing agents, corrosion inhibitors, viscosity modifying agents, biocides, and the like.

In preferred embodiments, the polishing compositions further comprise a biocidal amount of a biocide (e.g., an isothiazolinone composition such as KATHON® biocide, available from Rohm and Haas).

The aqueous carrier can be any aqueous solvent, e.g., water, aqueous methanol, aqueous ethanol, a combination thereof, and the like. Preferably, the aqueous carrier comprises predominately deionized water.

The polishing compositions of the invention can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., ceria, acids, polymers, buffers, oxidizing agents, and the like), as well as any combination of ingredients. For example, the ceria abrasive can be dispersed in water, combined with the polymer components, and mixed by any method that is capable of incorporating the components into the polishing composition. Typically, an oxidizing agent, when utilized, is not added to the polishing composition until the composition is ready for use in a CMP process, for example, the oxidizing agent can be added just prior to initiation of polishing. The pH can be further adjusted at any suitable time by addition of an acid or base, as needed.

The polishing compositions of the present invention also can be provided as a concentrate, which is intended to be diluted with an appropriate amount of aqueous solvent (e.g., water) prior to use. In such an embodiment, the polishing composition concentrate can include the various components dispersed or dissolved in aqueous solvent in amounts such that, upon dilution of the concentrate with an appropriate amount of aqueous solvent, each component of the polishing composition will be present in the polishing composition in an amount within the appropriate range for use.

The invention also provides a method of chemically-mechanically polishing a silicon nitride substrate, e.g., for selective removal of silicon nitride relative to removal of polysilicon. The method comprises (i) contacting a surface of a silicon nitride-containing substrate with a polishing pad and a polishing composition of the invention as described herein, and (ii) moving the polishing pad relative and the surface of the substrate relative to one another, while maintaining at least a portion of the polishing composition between the pad and the surface, thereby abrading at least a portion of the surface to polish the substrate.

The polishing compositions of the present invention can be used to polish any suitable substrate, and are especially useful for polishing substrates comprising silicon nitride, as well as substrates containing silicon nitride and polysilicon and/or silicon oxide. The compositions of the present invention provide relatively high silicon nitride removal rates at abrasive levels low enough to avoid excessive scratch defects. In particular, the formulation and pH of the CMP composition can be varied to vary the silicon nitride removal rate. In addition, the relative rate of silicon nitride removal exceeds the rate for removal of polysilicon and silicon oxide. This selectivity is an additional asset for use in polishing modern semiconductor materials with relatively narrow oxide line widths.

The polishing compositions of the present invention are particularly suited for use in conjunction with a chemical-mechanical polishing apparatus. Typically, the CMP apparatus comprises a platen, which, when in use, is in motion and has a velocity that results from orbital, linear, and/or circular motion, a polishing pad in contact with the platen and moving relative to the platen when in motion, and a carrier that holds a substrate to be polished by contacting and moving relative to the surface of the polishing pad. The polishing of the substrate takes place by the substrate being placed in contact with the polishing pad and a polishing composition of the invention and then moving the polishing pad relative to the substrate, so as to abrade at least a portion of the substrate to polish the substrate.

A substrate can be planarized or polished with a polishing composition of the invention using any suitable polishing surface (e.g., polishing pad). Suitable polishing pads include, for example, woven and non-woven polishing pads, grooved or non-grooved pads, porous or non-porous pads, and the like. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. No. 5,196,353 to Sandhu et al., U.S. Pat. No. 5,433,651 to Lustig et al., U.S. Pat. No. 5,949,927 to Tang, and U.S. Pat. No. 5,964,643 to Birang et al. Desirably, the inspection or monitoring of the progress of the polishing process with respect to a workpiece being polished enables the determination of the polishing end-point, i.e., the determination of when to terminate the polishing process with respect to a particular workpiece.

The following examples further illustrate certain aspects of the invention, but, of course, should not be construed as in any way limiting its scope. As used herein and in the following examples and claims, concentrations reported as parts-per-million (ppm) are based on the weight of the active component of interest divided by the weight of the composition (e.g., as milligrams of component per kilogram of composition).

EXAMPLE 1

This example illustrates the effect of cationic polymers on removal of silicon nitride, polysilicon, and silicon oxide.

Polishing compositions were used to separately chemically-mechanically polish silicon nitride, silicon oxide, and polysilicon blanket wafers on an Applied Materials REFLEXION® CMP apparatus. Each of the polishing compositions comprised an aqueous slurry of about 0.2 wt % calcined ceria (Advanced Nano Products Co., Ltd., "ANP", average particle size of about 100 nm), in deionized water at a pH of about 4. Additional components of the CMP compositions are shown in Table 1, in which "Quat" refers to poly (methacryloyloxyethyl trimethylammonium chloride) from Alco Chemical (Alco 4773); 4-PVP refers to poly(4-vinylpyridine); and 2-PVP refers to poly (2-vinylpyridine).

TABLE 1

| Example | Quat, ppm | 4-PVP, ppm | 2-PVP, ppm |
|---------|-----------|------------|------------|
| 1A      | 30        | 0          | 0          |
| 1B      | 0         | 30         | 0          |
| 1C      | 0         | 0          | 30         |
| 1D      | 15        | 30         | 0          |

Each composition was used to separately polish 300 mm diameter blanket wafers of silicon nitride, polysilicon, and plasma enhanced tetraethylorthosilicate-derived silicon dioxide (PETEOS) on a REFEXION® CMP apparatus with a D100 polishing pad at a downforce (DF) of about 3.5 psi, a polishing head speed (HS) of about 100 rpm, a platen speed (PS) of about 10 rpm, and a slurry flow rate of about 250 mL/min. The pad was conditioned in situ with a 3M A165 conditioner. The observed removal rates (RR) for silicon nitride (Nitride), polysilicon (PolySi) and PETEOS (Oxide), in Å/min, are shown in Table 2. Removal rates obtained at a DF of about 2 psi and HS/PS of about 93/93 rpm, are shown in parentheses.

TABLE 2

| Example | Nitride RR | PolySi RR | Oxide RR |
|---------|------------|-----------|----------|
| 1A | 1669 | 2800 (39) | 2585 |
| 1B | 828 (403) | 16 (9) | 391 (247) |
| 1C | 950 (465) | 11 (13) | 383 (207) |
| 1D | 1257 (998) | 11 (10) | 371 (224) |

The results in Table 2 demonstrate that the poly(vinylpyridine) polymers or a combination of poly(vinylpyridine) and quaternary ammonium-substituted polymer provided very good nitride removal rates (>800 Å/min), low polysilicon removal rates (<20 Å/min), and moderate oxide removal rates (371 to 391 Å/min) under the specified polishing conditions. In addition, the results at the lower DF of 2 psi indicate a synergy between the poly(vinylpyridine) and the quaternized polymer, since the removal rate at lower downforce did not decrease as significantly for Example 1D compared to Examples 1B and 1C.

EXAMPLE 2

Evaluations similar to those in Example 1 were performed on a Mirra polisher. Surprisingly, the observed polysilicon removal rates in the Mirra runs were considerably non-uniform (within wafer), exhibiting areas of very high and very low polysilicon removal. Addition of a polyoxyalkylene polymer, such as a PEG or PEG-PPG-PEG copolymer, surprisingly greatly improved the polysilicon removal uniformity on the Mirra polisher and provided the desired, consistently low, polysilicon removal rates. Compositions comprising various polyoxyalkylene polymers were prepared and evaluated under the following conditions: D100 pad with in situ conditioning as described above, DF of about 3 psi, PS/HS of about 100/101 rpm, and a slurry flow rate of about 150 mL/min. Each of the compositions comprised about 0.2 wt % ANP calcined ceria, about 30 ppm of poly(4-vinylpyridine), and about 15 ppm of poly(methacryloyloxyethyl trimethylammonium chloride) at a pH of about 4 in water. The polyoxyalkylene additives and the observed removal rates are shown in Table 3 (PL31 is PLURONIC® L31 from BASF, a polypropylene glycol) block copolymer with poly(ethylene glycol) end blocks, PEG-PPG-PEG).

TABLE 3

| Example | Nitride RR | PolySi RR | Oxide RR |
|---------|------------|-----------|----------|
| 2A (control), ceria only | 251 | 320 | 1887 |
| 2B (reference), no PEG | 938 | 219 | 254 |
| 2C, 300 ppm PEG 1450 | 928 | 16 | 244 |
| 2D, 800 ppm PEG 1450 | 925 | 17 | 184 |
| 2E, 800 ppm PEG 300 | 942 | 82 | 228 |
| 2F, 500 ppm PL31 | 794 | 16 | 216 |
| 2G, 1000 ppm PL31 | 745 | 20 | 193 |
| 2H, hydrated ceria, no PEG | 852 | 1106 | 274 |

The results in Table 3 demonstrate a high level of selectivity for removal of nitride relative to polysilicon. An examination of the polished wafers demonstrated a good within wafer uniformity for the polysilicon wafers polished with the polyoxyalkylene polymers (i.e., PEG and PEG-PPG-PEG polymers).

In addition, a composition comprising hydrated ceria in place of ANP calcined ceria similar to Example 2B (no polyoxyalkylene polymer) was evaluated. This example surprisingly provided a selectivity for removal of polysilicon over silicon nitride which is directly opposite the selectivity observed with the compositions of the present invention which utilize calcined ceria.

EXAMPLE 3

Additional aqueous compositions comprising calcined ceria at 0.1, 0.2 and 0.3 wt %, poly(4-vinylpyridine) at 0, 30, 60, and 90 ppm, poly(methacryloyloxyethyl trimethylammonium chloride) (Alco 4773) at 0, 15, and 30 ppm, and PEG-1450 at 0, 800 and 1500 ppm were evaluated by polishing blanket wafers of silicon nitride, polysilicon, and PETEOS on a Mirra polisher (DF of about 3 psi, D100 pad conditioned in situ with a 3M A165 conditioner, PS/HS of about 100/101 rpm, slurry flow rate of about 150 mL/min. The formulations of the compositions are shown in Table 4.

TABLE 4

| Example (wt % Ceria) | 4-PVP, ppm | Quat, ppm | PEG, ppm |
|----------------------|------------|-----------|----------|
| 3A (0.2), pH 4 | 0 | 0 | 0 |
| 3B (0.2), pH 4 | 30 | 15 | 800 |
| 3C (0.2), pH 4 | 30 | 15 | 1500 |
| 3D (0.2), pH 4 | 60 | 15 | 800 |
| 3E (0.2), pH 4 | 90 | 15 | 800 |
| 3F (0.2), pH 4 | 90 | 30 | 800 |
| 3G (0.1), pH 4 | 30 | 15 | 800 |
| 3H (0.1), pH 4 | 90 | 30 | 800 |
| 3I (0.3), pH 4 | 60 | 15 | 800 |
| 3J (0.2), pH 3.5 | 30 | 15 | 800 |

Polishing results are provided in Table 5.

TABLE 5

| Example | Oxide RR | PolySi RR | Nitride RR | Nitride/PolySi Selectivity | Nitride/Oxide Selectivity |
|---------|----------|-----------|------------|----------------------------|---------------------------|
| 3A | 1971 | 387 | 466 | 1.2 | 0.2 |
| 3B | 279 | 16 | 907 | 56.9 | 3.2 |
| 3C | 257 | 6 | 878 | 136.3 | 3.4 |
| 3D | 144 | 13 | 842 | 62.6 | 5.9 |
| 3E | 75 | 20 | 831 | 41.2 | 11.1 |
| 3F | 73 | 10 | 914 | 91.1 | 12.6 |
| 3G | 170 | 60 | 770 | 12.9 | 4.5 |
| 3H | 29 | 8 | 725 | 89.8 | 24.8 |
| 3I | 182 | 33 | 853 | 26 | 4.7 |
| 3J | 207 | 96 | 887 | 9.2 | 4.3 |

The results in Table 5 demonstrate a high level of selectivity for removal of nitride relative to polysilicon and silicon oxide over the range of abrasive concentration, cationic polymer concentration and PEG concentration evaluated. Decreasing the pH from 4 to 3.5 resulted in an increase in the PolySi rate and a decrease of selectivity (compare 3B to 3J). Increasing the PEG concentration slightly lowered the removal rates for each substrate (compare 3B and 3C). Increasing the 4-PVP concentration from 30 to 60 to 90 ppm lead to a modest linear decrease in Oxide and Nitride removal rates, but did not significantly affect PolySi removal rates. A lower concentration of ceria tended to decrease the Nitride and Oxide rates, but increase the PolySi rates (compare 3B to 3G or 3E to 3H). In addition, the polished wafers exhibited similar, generally flat Oxide and PolySi removal profiles.

In a separate experiment, the effect of polishing time on removal rates was evaluated. The observed PolySi and Oxide removal rates were relatively unaffected by varying the polishing time from 30 seconds to 90 seconds, whereas the Nitride removal rate increased about 3-fold from 400 to over 1200 over the same time period.

Evaluation of patterned polysilicon wafers also afforded low levels of polysilicon removal in agreement with the low polysilicon removal rates observed with blanket wafers.

EXAMPLE 4

Selected compositions from Example 3 (i.e., 3B, 3C, 3F and 3J) were evaluated by polishing 300 mm blanket wafers of silicon nitride, polysilicon, and PETEOS on a REFLEXION® polisher (i.e., as used in Example 1) under the following conditions: DF of about 2 psi, IC1010 polishing pad with Seasol conditioner, PS/HS of about 100/85 rpm, slurry flow rate of about 200 mL/min. The polishing results are shown in Table 6, and graphically in FIG. 1.

TABLE 6

| Composition (wt % Ceria) | Oxide RR | PolySi RR | Nitride RR |
|---|---|---|---|
| 3B (0.2), pH 4 | 254 | 10 | 893 |
| 3C (0.2), pH 4 | 244 | 10 | 887 |
| 3F (0.2), pH 4 | 159 | 6 | 924 |
| 3J (0.2), pH 3.5 | 221 | 10 | 856 |

The results in Table 6 demonstrate that the same high selectivity for removal of nitride relative to removal of polysilicon and silicon oxide observed on the Mirra polisher are also provided on a REFLEXION® polisher.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All numerical values obtained by measurement (e.g., weight, concentration, physical dimensions, removal rates, flow rates, and the like) are not to be construed as absolutely precise numbers, and should be considered to encompass values within the known limits of the measurement techniques commonly used in the art, regardless of whether or not the term "about" is explicitly stated. All methods described herein can be performed in any suitable order unless otherwise indicated herein or otherwise clearly contradicted by context. The use of any and all examples, or exemplary language (e.g., "such as") provided herein, is intended merely to better illuminate certain aspects of the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. An acidic aqueous polishing composition suitable for polishing a silicon nitride-containing substrate in a chemical-mechanical polishing (CMP) process, the composition comprising:
   (a) about 0.01 to about 10 percent by weight of a particulate calcined ceria abrasive;
   (b) about 10 to about 100,000 ppm of at least one cationic polymer selected from the group consisting of (a) a poly(vinylpyridine) polymer and (b) a combination of a poly(vinylpyridine) polymer and a quaternary ammonium-substituted polymer;
   (c) about 10 to about 200,000 ppm of a polyoxyalkylene polymer; and
   (d) an aqueous carrier therefor, wherein the composition has a pH in the range of about 3 to about 6.

2. The composition of claim 1 wherein the abrasive is present in the composition at a concentration in the range of about 0.05 to about 5 percent by weight.

3. The composition of claim 1 wherein the at least one cationic polymer is present in the composition at a concentration in the range of about 15 to about 10,000 ppm.

4. The composition of claim 1 wherein the polyoxyalkylene polymer is present in the composition at a concentration in the range of about 200 to about 100,000 ppm.

5. The composition of claim 1 wherein the polyoxyalkylene polymer comprises a poly(ethylene glycol) polymer, a poly(ethylene glycol)-co-poly(propylene glycol) block copolymer, or a combination thereof.

6. The composition of claim 1 wherein the polyoxyalkylene polymer comprises a poly(ethylene glycol) polymer comprising an average number of ethylene glycol monomer units in the range of about 300 to about 1500.

7. The composition of claim 1 wherein the quaternary ammonium-substituted polymer comprises a quaternary ammonium-substituted acrylate or methacrylate polymer.

8. The composition of claim 1 wherein the poly(vinylpyridine) polymer comprises poly(4-vinylpyridine).

9. The composition of claim 1 wherein the poly(vinylpyridine) polymer comprises poly(2-vinylpyridine).

10. Then composition of claim 1 wherein the poly(vinylpyridine) polymer is a copolymer comprising at least one vinylpyridine monomer and at least one comonomer selected from the group consisting of a nonionic monomer and a cationic monomer.

11. The composition of claim 1 wherein the at least one cationic polymer comprises a combination of a poly(vinylpyridine) polymer and a quaternary ammonium-substituted acrylate or methacrylate polymer.

12. The composition of claim 1 wherein the at least one cationic polymer comprises a combination of about 10 to about 90 ppm of a poly(vinylpyridine) polymer and about 15 to about 100 ppm of a poly(methacryloyloxyethyl trimethylammonium halide) polymer.

13. The composition of claim 1 wherein the aqueous carrier comprises deionized water.

14. A chemical-mechanical polishing (CMP) method for polishing a surface of a substrate, the method comprising abrading the surface of the substrate with a composition of claim 1, wherein the composition, as used, comprises about 0.01 to about 2 percent by weight of the ceria abrasive, about 10 to about 1000 ppm of the at least one cationic polymer, and about 10 to about 2000 ppm of the polyoxyalkylene polymer.

15. The method of claim 14 wherein the surface of the substrate comprises silicon nitride, polysilicon, and silicon dioxide.

16. An acidic aqueous polishing composition suitable for selective removal of silicon nitride relative to polysilicon in a chemical-mechanical polishing (CMP) process, the composition comprising:
  (a) about 0.05 to about 5 percent by weight of a particulate calcined ceria abrasive;
  (b) about 15 to about 10,000 ppm of at least one cationic polymer selected from the group consisting of (a) a poly(vinylpyridine) polyther and (b) a combination of a poly(vinylpyridine) polymer and a quaternary ammonium-substituted polymer;
  (c) about 200 to about 100,000 ppm of a polyoxyalkylene polymer selected from a poly(ethylene glycol) polymer, a poly(ethylene glycol)-co-poly(propylene glycol) block copolymer, or a combination thereof; and
  (d) an aqueous carrier therefor;
  wherein the composition has a pH in the range of about 3 to about 6.

17. The composition of claim 16 wherein the at least one cationic polymer comprises a combination of about 10 to about 90 ppm of a poly(vinylpyridine) polymer and about 15 to about 100 ppm of a poly(methacryloyloxyethyl trimethylanunoniunt halide) polymer.

18. The composition of claim 16 wherein the poly(ethylene glycol) polymer comprises an average number of ethylene glycol monomer units in the range of about 200 to about 2000.

19. A chemical-mechanical polishing (CMP) method for polishing a surface of a substrate, the method comprising abrading the surface of the substrate with a composition of claim 16, wherein the composition, as used, comprises about 0.05 to about 0.5 percent by weight of the ceria abrasive, about 10 to about 100 ppm of the at least one cationic polymer, and about 200 to about 1000 ppm of the polyoxyalkylene polymer.

20. The method of claim 19 wherein the surface of the substrate comprises silicon nitride, polysilicon, and silicon dioxide.

21. A chemical-mechanical polishing (CMP) method for selectively removing silicon nitride from a surface of a substrate in preference to removal of polysilicon, the method comprising the steps of:
  (a) contacting a surface of a silicon nitride- and polysilicon-containing substrate with a polishing pad and an acidic aqueous CMP composition; and
  (b) causing relative motion between the polishing pad and the substrate while maintaining a portion of the CMP composition in contact with the surface between the pad and the substrate for a time period sufficient to abrade silicon nitride from the surface;
  wherein the CMP composition comprises:
  (i) about 0.01 to about 2 percent by weight of a particulate calcined ceria abrasive;
  (ii) about 10 to about 1000 ppm of at least one cationic polymer selected from the group consisting of (a) a poly(vinylpyridine) polymer and (b) a combination of a poly(vinylpyridine) polymer and a quaternary ammonium-substituted polymer;
  (iii) about 10 to about 2000 ppm of a polyoxyalkylene polymer; and
  (iv) an aqueous carrier therefor.

22. The method of claim 21 wherein the at least one cationic polymer of the CMP composition comprises a combination of a poly(vinylpyridine) polymer and a quaternary ammonium-substituted polymer.

23. The method of claim 21 wherein the quaternary ammonium-substituted polymer comprises a quaternary ammonium-substituted acrylate or methacrylate polymer.

24. The method of claim 21 wherein the quaternary ammonium-substituted polymer comprises a poly(methacryloyloxyethyl tritnethylammonium halide) polymer.

25. The method of claim 21 wherein the at least one cationic polymer of the CMP composition comprises at least one polymer selected from the group consisting of a poly(2-vinylpyridine) polymer, a poly(4-vinylpyridine) polymer, and a copolymer comprising at least one vinylpyridine monomer and at least one comonomer selected from the group consisting of a nonionic monomer and a cationic monomer.

26. The method of claim 21 wherein the polyoxyalkylene polymer of the CMP composition comprises a poly(ethylene glycol) polymer, a poly(ethylene glycol)-co-poly(propylene glycol) block copolymer, or a combination thereof.

27. The method of claim 21 wherein the CMP composition has a pH in the range of about 3 to about 6.

28. The method of claim 21 wherein the surface of the substrate also comprises silicon dioxide.

* * * * *